(12) United States Patent
He

(10) Patent No.: US 11,609,500 B2
(45) Date of Patent: Mar. 21, 2023

(54) FILTER DEVICE AND PHOTORESIST COATING SYSTEM

(71) Applicant: HKC CORPORATION LIMITED, Guangdong (CN)

(72) Inventor: Huailiang He, Guangdong (CN)

(73) Assignee: HKC CORPORATION LIMITED, Guangdong (CN)

( * ) Notice: Subject to any disclaimer, the term of this patent is extended or adjusted under 35 U.S.C. 154(b) by 179 days.

(21) Appl. No.: 17/043,634

(22) PCT Filed: Dec. 19, 2018

(86) PCT No.: PCT/CN2018/121893
§ 371 (c)(1),
(2) Date: Sep. 29, 2020

(87) PCT Pub. No.: WO2020/113680
PCT Pub. Date: Jun. 11, 2020

(65) Prior Publication Data
US 2021/0033976 A1 Feb. 4, 2021

(30) Foreign Application Priority Data
Dec. 4, 2018 (CN) .......................... 201811478710.X

(51) Int. Cl.
*B05C 11/10* (2006.01)
*G03F 7/16* (2006.01)
(Continued)

(52) U.S. Cl.
CPC .............. *G03F 7/16* (2013.01); *B01F 23/43* (2022.01); *B01F 27/05* (2022.01); *B01F 35/187* (2022.01)

(58) Field of Classification Search
USPC ......... 118/52, 612, 319, 320, 610, 712, 600, 118/602, 692
See application file for complete search history.

(56) References Cited

U.S. PATENT DOCUMENTS

| 2009/0092924 | A1* | 4/2009 | Muroi | G03F 7/0397 430/326 |
| 2014/0260963 | A1 | 9/2014 | Wang | |
| 2015/0000517 | A1* | 1/2015 | Yoshihara | G03F 7/16 95/1 |
| 2015/0125793 | A1* | 5/2015 | Yoshihara | H01L 21/67017 118/600 |

(Continued)

FOREIGN PATENT DOCUMENTS

| CN | 1766734 A | 5/2006 |
| CN | 1928720 A | 3/2007 |

(Continued)

OTHER PUBLICATIONS

English Translation CN-106391358B (Year: 2017).*
(Continued)

*Primary Examiner* — Yewebdar T Tadesse

(57) ABSTRACT

The present disclosure provides a filter device and a photoresist coating system, and the filter device includes: a liquid storage tank, configured to hold photoresist to be filtered; a stirring structure, including a stirring tank and a stirring assembly at least partially received in the stirring tank; a first pipeline, one end of the first pipeline communicates with the liquid storage tank, and the other end of the first pipeline communicates with the stirring tank; a first filter assembly, provided on the first pipeline and located between the liquid storage tank and the stirring tank; a first pressure detection assembly, provided on the first pipeline and configured to detect a pressure of the photoresist in the first pipeline; and a second pipeline, one end of the second pipeline communicates with the stirring tank, and the other end of the second pipeline communicates with the coating device.

18 Claims, 2 Drawing Sheets

(51) Int. Cl.
  B01D 36/00 (2006.01)
  B01F 23/43 (2022.01)
  B01F 27/05 (2022.01)
  B01F 35/00 (2022.01)

(56) References Cited

U.S. PATENT DOCUMENTS

2015/0328650 A1* 11/2015 Carcasi .................. G03F 7/162
    222/145.5
2015/0331322 A1* 11/2015 Carcasi .................. B05B 7/26
    222/1
2019/0282931 A1* 9/2019 Zheng .................... B01D 19/02

FOREIGN PATENT DOCUMENTS

| | | | |
|---|---|---|---|
| CN | 104932203 | A | 9/2015 |
| CN | 205903683 | U | 1/2017 |
| CN | 106391358 | A | 2/2017 |
| CN | 106463357 | A | 2/2017 |
| CN | 207502908 | U | 6/2018 |
| CN | 208098509 | U | 11/2018 |
| EP | 1240932 | A2 | 9/2002 |
| WO | 2006057345 | A1 | 6/2006 |

OTHER PUBLICATIONS

First Office Action in counterpart Chinese Application No. 201811478710.X, dated Mar. 20, 2020.
The Second Office Action in counterpart Chinese Application No. 201811478710.X, dated Aug. 5, 2020.
International Search Report in corresponding PCT Application No. PCT/CN2018/121893, dated Sep. 2, 2019.
Written Opinion of the International Searching Authority in corresponding PCT Application No. PCT/CN2018/121893, dated Sep. 2, 2019.

* cited by examiner

US 11,609,500 B2

FILTER DEVICE AND PHOTORESIST COATING SYSTEM

CROSS-REFERENCE TO RELATED APPLICATIONS

The present disclosure is the National Stage of International Application with No. PCT/CN2018/121893, filed on Dec. 19, 2018, which claims the benefit of Chinese Patent Application with No. 201811478710.X, filed on Dec. 4, 2018 and entitled "Filter Device and Photoresist Coating System", the entirety of which is incorporated herein by reference.

FIELD

The present disclosure relates to the field of semiconductor processing equipment, and in particular, to a filter device and a photoresist coating system.

BACKGROUND

Photosensitive materials such as photoresist are often used in the semiconductor processing process. Photoresist may be used in many industrial processes. Generally, photoresist usually goes through transportation and storage from production to final use. During use, particles are prone to be formed in the photoresist, which is prone to cause defects in the products when the photoresist having particles is directly coated on the product substrate. As a result, the yield of the product may be decreased. The statements herein merely provide background information related to the present disclosure and do not necessarily constitute prior art.

SUMMARY

The main purpose of the present disclosure is to provide a filter device, which has excellent filtering performance and good dispersibility.

In order to achieve the above purpose, the present disclosure provides a filter device, which is applied to a photoresist coating system, and the filter device includes:

a liquid storage tank, configured to hold photoresist to be filtered;

a stirring structure, including a stirring tank and a stirring assembly at least partially received in the stirring tank;

a first pipeline, one end of the first pipeline communicates with the liquid storage tank, and the other end of the first pipeline communicates with the stirring tank;

a first filter assembly, provided on the first pipeline and located between the liquid storage tank and the stirring tank;

a first pressure detection assembly, provided on the first pipeline and configured to detect a pressure of the photoresist in the first pipeline; and a second pipeline, one end of the second pipeline communicates with the stirring tank, and the other end of the second pipeline is connected to a coating device.

In one embodiment, the liquid storage tank includes a tank body and a first adapter. The tank body has a receiving cavity configured to hold the photoresist and defines a first opening communicating with the receiving cavity. The first adapter is installed at the first opening, and one end of the first pipeline passes through the first adapter to be received in the receiving cavity.

The filter device further includes a vent pipe, and one end of the vent pipe passes through the first adapter to be received in the receiving cavity, and the other end of the vent pipe is connected with an air pump.

In one embodiment, the first adapter defines a first adjustment hole communicating with the receiving cavity. One end of the first pipeline passes through the first adjustment hole and extends into the receiving cavity, and a length of the first pipeline extending into the receiving cavity is adjustable through the first adjustment hole.

And/or, the first adapter defines a second adjustment hole communicating with the receiving cavity. One end of the vent pipe passes through the second adjustment hole and extending into the receiving cavity, and a length of the vent pipe extending into the receiving cavity is adjustable through the second adjustment hole.

And/or, the length of the first pipeline extending into the receiving cavity is greater than the length of the vent pipe extending into the receiving cavity.

And/or, the liquid storage tank further includes a sealing ring provided at the first opening, and the sealing ring is sandwiched between the first adapter and inner wall of the first opening, and configured to seal the first adapter and the first opening of the tank body.

In one embodiment, the first filter assembly includes a first filter element and a second filter element which are provided in series in the first pipeline. The first filter element is close to the liquid storage tank, and the second filter element is close to the stirring tank. A pore size of the first filter element is greater than or equal to a pore size of the second filter element.

The first pressure detection assembly includes a first pressure detector and a second pressure detector. The first pressure detector is located between the liquid storage tank and the first filter element, and configured to detect a pressure of the photoresist in the first pipeline before filtering. The second pressure detector is located between the second filter element and the stirring tank, configured to detect a pressure of the photoresist in the first pipeline after filtering.

In one embodiment, the stirring tank defines a second opening and a second adapter covering the second opening, and the other end of the first pipeline and one end of the second pipeline pass through the second adapter and extending into the stirring tank.

The stirring assembly includes a stirring rod rotatably penetrating the second adapter, a stirring head, and an actuator. The stirring head is connected to one end of the stirring rod extending into the stirring tank, and the actuator is provided at one end of the stirring rod away from the stirring head. The actuator drives the stirring rod to drive the stirring head to rotate, to stir the photoresist in the stirring tank.

In one embodiment, the filter device further includes:

a second filter assembly, including a third filter element and a fourth filter element which are provided in series on the second pipeline, and the third filter element and the fourth filter element are located between the stirring tank and the coating device; the third filter element is close to the stirring tank, and the fourth filter element is close to the coating device, and a pore size of the third filter element is greater than or equal to a pore size of the fourth filter element;

a second pressure detection assembly, provided on the second pipeline, and the second pressure detection assembly includes a third pressure detector and a fourth pressure detector; the third pressure detector is located between the stirring tank and the third filter element, configured to detect a pressure of the photoresist in the second pipeline before filtering; the fourth pressure detector is located between the fourth filter element and the coating device, configured to detect a pressure of the photoresist in the second pipeline after filtering.

In one embodiment, the filter device further includes a sampling detection assembly provided between the fourth pressure detector and the coating device, and the sampling detection assembly includes a sampling pipe connected to the second pipeline, and a sampling valve connected to the sampling pipe.

In one embodiment, the filter device further includes a first shutoff valve provided on the second pipeline, and the first shutoff valve is located between the sampling pipe and the coating device.

And/or, the filter device further includes a third pipeline and a second shutoff valve provided on the third pipeline. One end of the third pipeline communicates with the sampling pipe, and the other end of the third pipeline communicates with the stirring tank.

The present disclosure further provides a filter device, which is applied to a photoresist coating system, and the filter device includes:

a liquid storage tank, configured to hold photoresist to be filtered;

a stirring structure, including a stirring tank and a stirring assembly at least partially received in the stirring tank;

a first pipeline, one end of the first pipeline communicates with the liquid storage tank, and the other end of the first pipeline communicates with the stirring tank;

a first filter assembly, including a first filter element and a second filter element which are provided in series on the first pipeline, the first filter element and the second filter element being located between the liquid storage tank and the stirring tank;

a first pressure detection assembly, provided on the first pipeline and configured to detect a pressure of the photoresist in the first pipeline;

a second pipeline, one end of the second pipeline communicates with the stirring tank, and the other end of the second pipeline is connected to a coating device; and a second filter assembly, including a third filter element and a fourth filter element which are provided in series on the second pipeline, the third filter element and the fourth filter element being located between the stirring tank and the coating device;

pore sizes of the third filter element and the fourth filter element are different from pore sizes of the first filter element and the second filter element.

The present disclosure further provides a photoresist coating system, and the photoresist coating system includes:

a filter device as described above; and a coating device communicating with the stirring structure through the second pipeline.

According to the filter device of the present disclosure, the first filter assembly and the first pressure detection assembly are provided on the first pipeline, and the first pipeline communicates the liquid storage tank with the stirring tank. The first filter assembly filters the photoresist that are about to enter the stirring tank, and the first pressure detection assembly detects the pressure of the photoresist in the first pipeline to determine whether the photoresist in the first pipeline still has particles and other substances, thereby the filtering performance of the filter device is improved. Further, the photoresist in the stirring tank is dispersed through the stirring assembly, and the dispersed photoresist is directly provided to the coating device through the second pipeline and is coated on the product substrate, thereby the defect rate of the product is greatly reduced and the product quality is effectively improved.

BRIEF DESCRIPTION OF THE DRAWINGS

In order to more clearly illustrate the technical solutions in the embodiments of the present disclosure or the exemplary techniques, the drawings to be used in the embodiments or the description of the exemplary embodiments will be briefly described below. Obviously, the drawings in the following description are only certain embodiments of the present disclosure, and other drawings may be obtained according to the structures shown in the drawings without any creative work for those skilled in the art.

The implementation, functional features and advantages of the present disclosure will be further described with reference to the accompanying drawings.

DETAILED DESCRIPTION OF THE EMBODIMENTS

The technical solutions in the embodiments of the present disclosure are clearly and completely described in the following with reference to the drawings in the embodiments of the present disclosure. It is obvious that the described embodiments are only a part of the embodiments of the present disclosure, and not all of the embodiments. All other embodiments obtained by those of ordinary skill in the art without creative labor based on the embodiments here are within the scope of protection in the present disclosure.

It should be noted that all directional indications in the embodiments of the present disclosure are only used to explain relative positional relationship, motion situation, etc. between components in a certain posture. If the specific posture changes, the directional indication also changes accordingly.

In the present disclosure, the terms "connected", "fixed" and the like should be understood broadly, unless otherwise explicitly stated and defined. For example, "fixed" may be a fixed connection, or may be a detachable connection, or may be integrated; it may be a mechanical connection or an electrical connection; it may be directly connected or indirectly connected through an intermediate medium, and may be an internal connection of two elements or an interaction relationship of two elements unless explicitly defined otherwise. For those skilled in the art, the specific meanings of the above terms in the present disclosure can be understood on a case-by-case basis.

In addition, the descriptions of "first", "second", and the like in the present disclosure are used for the purpose of description only, and are not to be construed as indicating or implying their relative importance or implicitly indicating the number of technical features indicated. Thus, features defining "first" or "second" may include at least one of the features, either explicitly or implicitly. In addition, the technical solutions between the various embodiments may be combined with each other, but must be based on the realization of those skilled in the art, and when the combination of the technical solutions is contradictory or impossible to implement, it should be considered that the combination of the technical solutions does not exist, nor is it within the scope of protection required by this disclosure.

The present disclosure provides a filter device 100, which is applied to a photoresist coating system. It is understood that, the quality of product may be effectively improved by filtering and dispersing the photoresist with the filter device 100 before coating.

Figure 1:
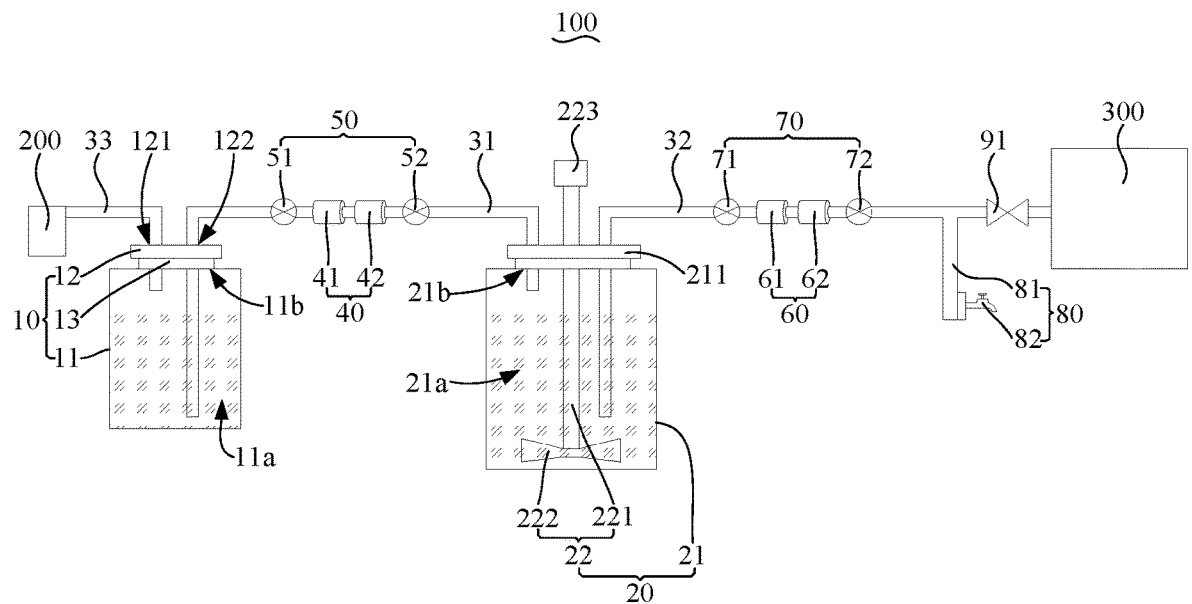
FIG. 1 is a schematic structural diagram of a filter device according to an embodiment of the present disclosure.
Figure 2:
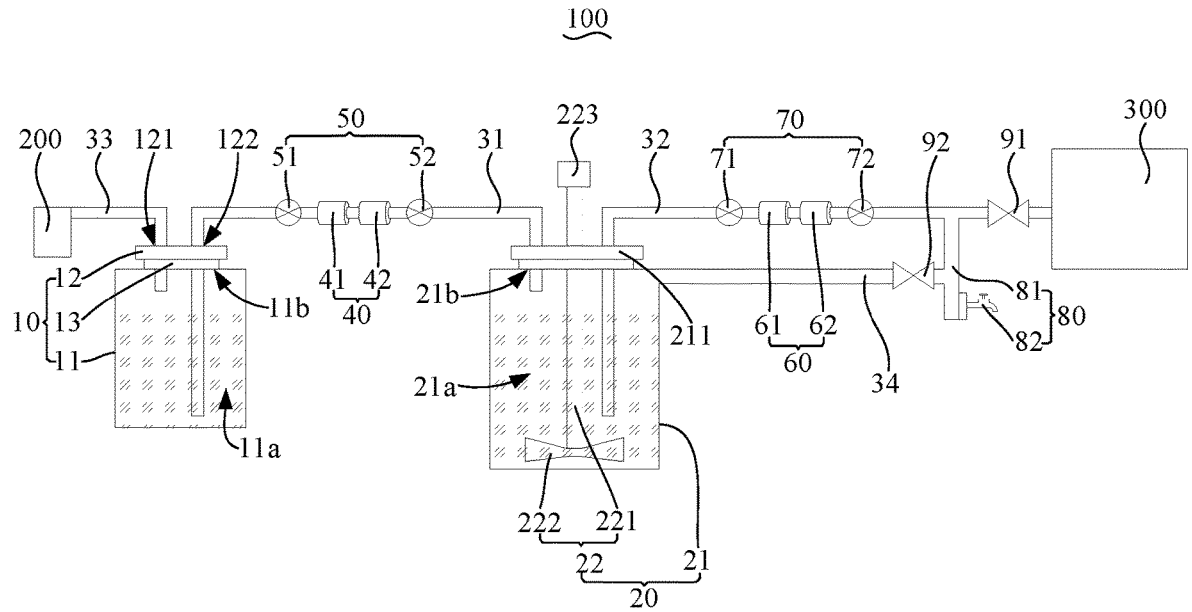
FIG. 2 is a schematic structural diagram of the filter device according to another embodiment of the present disclosure.
Figure 3:
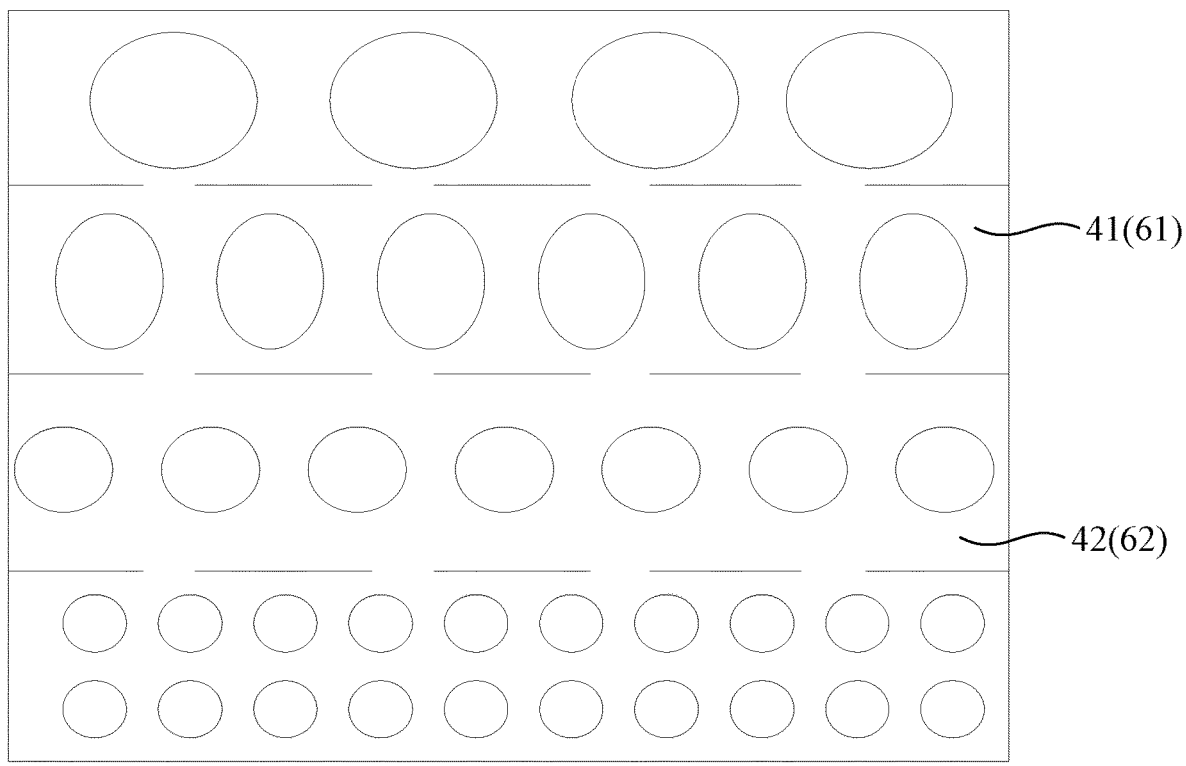
FIG. 3 is a schematic structural diagram of a filter element according to an embodiment of the present disclosure.

Referring to FIG. 1 to FIG. 3, in the embodiments of the present disclosure, the filtering device 100 includes:

a liquid storage tank 10, configured to hold photoresist to be filtered;

a stirring structure 20, including a stirring tank 21 and a stirring assembly 22 at least partially received in the stirring tank 21;

a first pipeline 31, one end of the first pipeline 31 communicates with the liquid storage tank 10, and the other end of the first pipeline 31 communicates with the stirring tank 21;

a first filter assembly 40, provided on the first pipeline 31 and located between the liquid storage tank 10 and the stirring tank 21;

a first pressure detection assembly 50, provided on the first pipeline 31 and configured to detect a pressure of the photoresist in the first pipeline 31; and a second pipeline 32, one end of the second pipeline 32 communicates with the stirring tank 21, and the other end of the second pipeline 32 is connected to a coating device 300.

Specifically, the liquid storage tank 10 of the filter device 100 is configured to store and hold the photoresist, and the first pipeline 31 communicates the liquid storage tank 10 with the stirring tank 21 of the stirring structure 20. The first filter assembly 40 is provided on the first pipeline 31 and located between the liquid storage tank 10 and the stirring tank 21, so that the photoresist in the liquid storage tank 10 is filtered when passing through the first filter assembly 40 on the first pipeline 31, thereby the particles and other substances in the photoresist are effectively filtered out. The first pressure detection assembly 50 is provided on the first pipeline 31 and is able to detect the pressure of the photoresist in the first pipeline 31 and determine whether particles and other substances still exist, thereby the filtration effect of the filter device 100 is improved.

It is understood that, the stirring structure 20 further includes a stirring assembly 22. When the photoresist passes through the first filter assembly 40 and enters the stirring tank 21, it may be stirred and dispersed through the stirring assembly 22, thereby the dispersing performance of the photoresist is improved. The dispersed photoresist is directly connected to the coating device 300 through the second pipeline 32 to coat the photoresist on the product, thereby the quality of product is improved and the defects of the product are greatly reduced.

According to the filter device 100 of the technical solution of the present disclosure, the first filter assembly 40 and the first pressure detection assembly 50 are provided on the first pipeline 31, and the first pipeline 31 communicates the liquid storage tank 10 with the stirring tank 21. The first filter assembly 40 filters the photoresist that are about to enter the stirring tank 21, and the first pressure detection assembly 50 detects the pressure of the photoresist in the first pipeline 31 to determine whether particles and other substances still exist, thereby the filtering performance of the filter device 100 is improved. Further, the photoresist in the stirring tank 21 is dispersed through the stirring assembly 22, and the dispersed photoresist is directly connected to the coating device 300 through the second pipeline 32 and coated on the product substrate, thereby the defect rate of the product is greatly reduced and the product quality is effectively improved.

In one embodiment, in order to facilitate the photoresist in the liquid storage tank 10 flowing into the first filter assembly 40 and the stirring tank 21 through the first pipeline 31, a liquid outlet may be defined at a bottom of the liquid storage tank 10, through which the first pipeline 31 communicates with the liquid storage tank 10. Certainly, in order to better control the amount of liquid discharged from the first pipeline 31, a switch valve may be provided at the liquid outlet to effectively control the amount of liquid discharged from the first pipeline 31.

Optionally, one end of the first pipeline 31 may also extend into the liquid storage tank 10 through a top of the liquid storage tank 10. In this case, a portion of the first pipeline 31 extending into the liquid storage tank 10 shall be located below the liquid level of the photoresist in the liquid storage tank 10, so that the photoresist in the liquid storage tank 10 is able to be pressed into the first pipeline 31 by air pressure or other means.

In this embodiment, the first filter assembly 40 may be a filter bucket or a filter. Certainly, the first filter assembly 40 may also be other structures having a filtering function, which is not limited herein. The first pressure detection assembly 50 may be a pressure sensor, a liquid pressure valve etc. Certainly, the first pressure detection assembly 50 may also be other structures capable of detecting the pressure of the liquid in the first pipeline 31, which is not limited herein.

In one embodiment, as shown in FIG. 1 and FIG. 2, the liquid storage tank 10 includes a tank body 11 and a first adapter 12. The tank body 11 has a receiving cavity 11a configured to hold the photoresist and defines a first opening 11b communicating with the receiving cavity 11a. The first adapter 12 is installed at the first opening 11b, and one end of the first pipeline 31 passes through the first adapter 12 to be received in the receiving cavity 11a.

The filter device 100 further includes a vent pipe 33, and one end of the vent pipe 33 passes through the first adapter 12 to be received in the receiving cavity 11a, and the other end of the vent pipe 33 is connected with an air pump 200.

Specifically, the tank body 11 has the receiving cavity 11a and defines the first opening 11b communicating with the receiving cavity 11a. It is understood that, the photoresist to be filtered may be loaded into the receiving cavity 11a of the tank body 11 through the first opening 11b of the tank body 11. Certainly, a liquid inlet communicating with the receiving cavity 11a may also be defined at the top of the tank body 11, through which the photoresist to be filtered may also be loaded into the receiving cavity 11a of the tank body 11, which is not limited herein. As an alternative to this embodiment, the first opening 11b of the tank body 11 serves as the inlet for loading the photoresist to be filtered, and also serves as the outlet for connecting the first pipeline 31.

As shown in FIG. 1 and FIG. 2, in this embodiment, in order to close the first opening 11b of the tank body 11, the first adapter 12 is provided at the first opening 11b. One end of the first pipeline 31 extends through the first adapter 12 to be received in the receiving cavity 11a, and extends below the liquid level of the photoresist in the receiving cavity 11a, thus facilitating the photoresist flowing into the first pipeline 31.

It is understood that, in order to further ensure the tightness of the tank body 11, the liquid storage tank 10 further includes a sealing ring 13 provided at the first opening 11b. The sealing ring 13 is sandwiched between the first adapter 12 and inner wall of the first opening 11b, and configured to seal the first adapter 12 and the first opening 11b of the tank body 11. It is understood that, the sealing ring 13 may be a gasket, a sealing ring or other structures capable of sealing, which is not limited herein.

In order to facilitate pressing the photoresist in the receiving cavity 11a of the tank body 11 into the first pipeline 31, the filter device 100 further provides the vent pipe 33. One end of the vent pipe 33 extends through the first adapter 12 to be received in the receiving cavity 11a, and the other end of the vent pipe 33 is connected to the air pump 200 to inject air into the sealed receiving cavity 11a of the tank body 11, so that the pressure inside the tank body 11 is able to be increased, thereby the photoresist is pressed into the first pipeline 31.

It is understood that, a portion of the vent pipe 33 extending into the receiving cavity 11a is located above the liquid level of the photoresist, so that the photoresist is able to be pressed into the first pipeline 31 without affecting the photoresist in the receiving cavity 11a of the tank body 11. In this embodiment, the air pump 200 may inject compressed nitrogen or compressed dry air through the vent pipe 33. Certainly, any other gas that shall not react with the photoresist may also be used, which is not limited herein.

In one embodiment, as shown in FIG. 1 and FIG. 2, the first adapter 12 defines a first adjustment hole 122 communicating with the receiving cavity 11a. One end of the first pipeline 31 passes through the first adjustment hole 122 and extending into the receiving cavity 11a, and a length of the first pipeline 31 extending into the receiving cavity 11a is adjustable through the first adjustment hole 122.

It is understood that, the first adapter 12 defines the first adjustment hole 122, through which the length of the first pipeline 31 extending into the receiving cavity 11a is adjustable according to the size and model of the tank body 11 and the amount of the photoresist in the tank body 11, thereby the usability and versatility of the filter device 100 are improved.

In this embodiment, the first adjustment hole 122 may be a threaded hole or a sliding hole. Certainly, the first adjustment hole 122 may be other structures capable of adjusting the length of the first pipeline 31 extending into the receiving cavity 11a, which is not limited herein. In order to improve the tightness of the tank body 11, a sealing structure may also be provided at the first adjustment hole 122, so that the tightness between the first pipeline 31 and the first adjustment hole 122 is able to be ensured when adjusting the first pipeline 31.

In one embodiment, as shown in FIG. 1 and FIG. 2, the first adapter 12 defines a second adjustment hole 121 communicating with the receiving cavity 11a. One end of the vent pipe 33 passes through the second adjustment hole 121 and extending into the receiving cavity 11a, and a length of the vent pipe 33 extending into the receiving cavity 11a is adjustable through the second adjustment hole 121.

It is understood that, the first adapter 12 defines the second adjustment hole 121, through which the length of the vent pipe 33 extending into the receiving cavity 11a is adjustable according to the size and model of the tank body 11 and the amount of the photoresist in the tank body 11, thereby the usability and versatility of the filter device 100 are improved. Optionally, the first adjustment hole 122 and the second adjustment hole 121 are spaced apart from each other on the first adapter 12.

In this embodiment, the second adjustment hole 121 may be a threaded hole or a sliding hole. Certainly, the second adjustment hole 121 may be other structures capable of adjusting the length of the vent pipe 33 extending into the receiving cavity 11a, which is not limited herein. In order to improve the tightness of the tank body 11, a sealing structure may also be provided at the second adjustment hole 121, so that the tightness between the vent pipe 33 and the second adjustment hole 121 is able to be ensured when adjusting the vent pipe 33.

As shown in FIG. 1 and FIG. 2, as an alternative to this embodiment, the length of the first pipeline 31 extending into the receiving cavity 11a is greater than the length of the vent pipe 33 extending into the receiving cavity 11a. In this way, when the air pump 200 injects gas through the vent pipe 33, the photoresist in the tank body 11 is able to be smoothly pressed into the first pipeline 31.

In one embodiment, as shown in FIG. 1 and FIG. 2, the first filter assembly 40 includes a first filter element 41 and a second filter element 42 which are provided in series in the first pipeline 31. The first filter element 41 is close to the liquid storage tank 10, and the second filter element 42 is close to the stirring tank 21. A pore size of the first filter element 41 is greater than or equal to a pore size of the second filter element 42.

It is understood that, the two filter elements are provided in series to ensure the filtering effect of the photoresist passing through the first filter assembly 40. In this embodiment, the first filter element 41 and the second filter element 42 generally include: PP cotton, Granular Activated Carbon, Reverse Osmosis (OS) membrane, post Activated Carbon, etc., which are configured to adsorb solid particles in the photoresist. In this embodiment, in order to achieve a better filtering effect, the pore size of the first filter element 41 is greater than or equal to the pore size of the second filter element 42. Namely, the photoresist in the first pipeline 31 passes through the first filter element 41 for the first adsorption and filtration, and then passes through the second filter element 42 for the second adsorption and filtration, so as to improve the filtering effect of the filter device 100 filtering the photoresist. Since the pore size of the second filter element 42 is less than or equal to the pore size of the first filter element 41, the solid particles in the photoresist may be further adsorbed and filtered after being filtered by the second filter element 42.

In one embodiment, as shown in FIG. 1 and FIG. 2, the first pressure detection assembly 50 includes a first pressure detector 51 and a second pressure detector 52; the first pressure detector 51 is located between the liquid storage tank 10 and the first filter elements 41, configured to detect a pressure of the photoresist in the first pipeline 31 before filtering; the second pressure detector 52 is located between the second filter element 42 and the stirring tank 21, configured to detect a pressure of the photoresist in the first pipeline 31 after filtering.

It is understood that, the first pressure detector 51 and the second pressure detector 52 are respectively provided on both sides of the first filter assembly 40, so that the pressure values detected by the first pressure detector 51 and the second pressure detector 52 are able to be used to judge whether the first filter assembly 40 is blocked, so as to determine whether there are still particles and other substances exist in the photoresist passing through the first filter assembly 40, thereby the filtering performance of the filter device 100 is improved.

In one embodiment, as shown in FIG. 1 and FIG. 2, the stirring tank 21 defines a second opening 21b and a second adapter 211 covering the second opening 21b, and the other end of the first pipeline 31 and one end of the second pipeline 32 pass through the second adapter 211 and extending into the stirring tank 21.

The stirring assembly 22 includes a stirring rod 221 rotatably penetrating the second adapter 211, a stirring head 222, and an actuator 223. The stirring head 222 is connected to one end of the stirring rod 221 extending into the stirring tank 21, and the actuator 223 is provided at one end of the stirring rod 221 away from the stirring head 222. The actuator 223 drives the stirring rod 221 to drive the stirring head 222 to rotate, to stir the photoresist in the stirring tank 21.

Specifically, the stirring tank 21 has a stirring cavity 21a, and the photoresist passes through the first filter assembly 40 and the first pressure detection assembly 50 in sequence through the first pipeline 31 to enter the stirring cavity 21a of the stirring tank 21. The second adapter 211 is defined at the second opening 21b of the stirring tank 21 to install and fix the first pipeline 31 and the second pipeline 32, through which the other end of the first pipeline 31 and one end of the second pipeline 32 extend into the stirring tank 21.

In order to improve the dispersing performance of the photoresist, the end of the stirring rod 221 where the stirring head 222 is connected extends into the stirring cavity 21a through the second adapter 211, and the stirring rod 221 is driven by the actuator 223 to drive the stirring head 222 to rotate, so as to stir the photoresist in the stirring cavity 21a, thereby the dispersing performance of the photoresist is improved. It is understood that, the stirring rod 221 and the second adapter 211 are rotatably connected by a structure such as a bearing, and the actuator 223 is also allowed to be fixed to the second adapter 211, which is not limited herein. The actuator 223 may be a motor, a driving motor, etc., and may be any other structures capable of driving the stirring rod 221 to rotate.

In one embodiment, as shown in FIG. 1 and FIG. 2, the filter device 100 further includes a second filter assembly 60, which includes a third filter element 61 and a fourth filter element 62 that are provided in series in the second pipeline 32. The third filter element 61 and the fourth filter element 62 are located between the stirring tank 21 and the coating device 300. The third filter element 61 is close to the stirring tank 21, and the fourth filter element 62 is close to the coating device 300. A pore size of the third filter element 61 is greater than or equal to a pore size of the fourth filter element 62.

In order to further improve the filtering performance of the filter device 100, the third filter element 61 and the fourth filter element 62 are provided in the second pipeline 32, so that the dispersed photoresist is filtered again, and the refiltered photoresist is piped to the coating device 300 through the second pipeline 32 for product coating, thereby the quality of product is improved and the defective rate of the product is reduced.

It is understood that, the third filter element 61 and the fourth filter element 62 are provided in series to ensure the filtering effect of the photoresist passing through the second filter assembly 60. In this embodiment, the third filter element 61 and the fourth filter element 62 generally include: PP cotton, Granular Activated Carbon, Reverse Osmosis (OS) membrane, post Activated Carbon, etc., which are configured to adsorb solid particles in the photoresist. In this embodiment, in order to achieve a better filtering effect, the pore size of the third filter element 61 is greater than or equal to the pore size of the fourth filter element 62. Namely, the photoresist in the second pipeline 32 passes through the third filter element 61 for the first adsorption and filtration, and then passes through the fourth filter element 62 for the second adsorption and filtration, so as to improve the filtering effect of the filter device 100 to filter the photoresist. Since the pore size of the fourth filter element 62 is less than or equal to the pore size of the third filter element 61, the solid particles in the photoresist are able to be further adsorbed and filtered after being filtered by the fourth filter element 62, thus the quality of the product coated by the coating device 300 is ensured.

In one embodiment, as shown in FIG. 1 and FIG. 2, the filtering device 100 further includes a second pressure detection assembly 70 provided on the second pipeline 32, and the second pressure detection assembly 70 includes a third pressure detector 71 and a fourth pressure detector 72. The third pressure detector 71 is located between the stirring tank 21 and the third filter elements 61, configured to detect a pressure of the photoresist in the second pipeline 32 before filtering, and the fourth pressure detector 72 is located between the fourth filter element 62 and the coating device 300, configured to detect a pressure of the photoresist in the second pipeline 32 after filtering.

It is understood that, the third pressure detector 71 and the fourth pressure detector 72 are respectively provided on both sides of the second filter assembly 60, so that the pressure values detected by the third pressure detector 71 and the fourth pressure detector 72 are able to be used to judge whether the second filter assembly 60 is blocked, so as to determine whether there are still particles and other substances exist in the photoresist passing through the second filter assembly 60, thereby the filtering performance of the filter device 100 is improved.

In one embodiment, a detecting port may be defined on the stirring tank 21 to detect the filtering effect and the dispersing effect of the photoresist in the stirring tank 21. If the detected filtering effect and the detected dispersing effect of the photoresist in the stirring tank 21 are desirable, the stirring tank 21 and the coating device 300 may be directly connected through the second pipeline 32. In this case, the filtering process of the photoresist in the stirring tank 21 by passing through the second filter assembly 60 and the second pressure detection assembly 70 is allowed to be skipped. If the detected filtering effect and the detected dispersing effect of the photoresist in the stirring tank 21 are poor, the photoresist in the second pipeline 32 shall be filtered again by passing through the second filter assembly 60 and the second pressure detection assembly 70, so as to ensure the quality of the product coated by the coating device 300.

In one embodiment, as shown in FIG. 1 and FIG. 2, the filter device 100 further includes a sampling detection assembly 80 provided between the fourth pressure detector 72 and the coating device 300, and the sampling detection assembly 80 includes a sampling pipe 81 connected to the second pipeline 32, and a sampling valve 82 connected to the sampling pipe 81.

It is understood that, the sampling detection assembly 80 is provided between the fourth pressure detector 72 and the coating device 300, and the filtering effect and the dispersing effect of the photoresist after passing through the second filter assembly 60 and the second pressure detection assembly 70 are detected by the sampling valve 82, so as to ensure the quality of the product coated by the coating device 300.

In one embodiment, as shown in FIG. 1 and FIG. 2, the filter device 100 further includes a first shutoff valve 91 provided on the second pipeline 32, and the first shutoff valve 91 is located between the sampling pipe 81 and the coating device 300. It is understood that, the first shutoff valve 91 is configured to facilitate controlling whether the photoresist continues to enter the coating device 300 for coating after passing through the filter device 100.

In one embodiment, as shown in FIG. 2, the filter device 100 further includes a third pipeline 34 and a second shutoff valve 92 provided on the third pipeline 34. One end of the third pipeline 34 communicates with the sampling pipe 81, and the other end of the third pipeline 34 communicates with the stirring tank 21.

It is understood that, the third pipeline 34 is configured to achieve cyclic filtering and dispersion. Namely, the filtering effect and the dispersing effect of the photoresist after passing through the second filter assembly 60 and the second pressure detection assembly 70 are detected by the sampling valve 82. If the filtering effect and the dispersing effect of the photoresist are desirable, in this case, the second shutoff valve 92 on the third pipeline 34 shall be closed, and the first shutoff valve 91 shall be opened, so that the photoresist after passing through the second filter assembly 60 and the second pressure detection assembly 70 directly enters the coating device 300 for coating; if the filtering effect and the dispersing effect of the photoresist are poor, in this case, the second shutoff valve 92 on the third pipeline 34 shall be opened, and the first shutoff valve 91 shall be closed, so that the photoresist after passing through the second filter assembly 60 and the second pressure detection assembly 70 passes through the third pipeline 34 to enter the stirring tank 21 again for dispersion, and then is filtered by passing through the second filter assembly 60 and the second pressure detection assembly 70.

It is understood that, in order to ensure that the photoresist entering the stirring tank 21 from the first pipeline 31 shall not flow back to the first pipeline 31, the end of the first pipeline 31 extending into the stirring tank 21 through the second adapter 211 stays to be above the liquid level of the photoresist in the stirring tank 21. In order to ensure that the photoresist in the stirring tank 21 smoothly enters the second pipeline 32, the end of the second pipeline 32 extending into the stirring tank 21 through the second adapter 211 stays to be below the liquid level of the photoresist in the stirring tank 21.

In this embodiment, the liquid inlet of the stirring tank 21 may be defined at the top of the stirring tank 21, and the liquid outlet of the stirring tank 21 may be defined at the bottom of the stirring tank 21, due to the flowability of the photoresist, the automatic flow of the photoresist in the stirring tank 21 may be achieved, which is not limited herein. Certainly, the liquid inlet and the liquid outlet may also be defined at the second opening 21b of the stirring tank 21 at the same time. As shown in FIG. 1 and FIG. 2, the liquid input of the first pipeline 31 and the liquid output of the second pipeline 32 may be realized simultaneously through the second adapter 211. In this case, the stirring cavity of the stirring tank 21 is sealed, and the photoresist in the stirring tank 21 may be pressed into the second pipeline 32 by injecting gas, so that the photoresist is able to smoothly pass through the second filter assembly 60 and the second pressure detection assembly 70 through the second pipeline 32 to enter the coating device 300.

In one embodiment, as shown in FIG. 1 and FIG. 2, the filter device 100 includes:

a liquid storage tank 10, configured to hold photoresist to be filtered;

a stirring structure 20, including a stirring tank 21 and a stirring assembly 22 at least partially received in the stirring tank 21;

a first pipeline 31, one end of the first pipeline 31 communicates with the liquid storage tank 10, and the other end of the first pipeline 31 communicates with the stirring tank 21;

a first filter assembly 40, including a first filter element 41 and a second filter element 42 which are provided in series on the first pipeline 31, and the first filter element 41 and the second filter element 42 are located between the liquid storage tank 10 and the stirring tank 21;

a first pressure detection assembly 50, provided on the first pipeline 31 and configured to detect a pressure of the photoresist in the first pipeline 31;

a second pipeline 32, one end of the second pipeline 32 communicates with the stirring tank 21, and the other end of the second pipeline 32 is connected to a coating device 300;

a second filter assembly 60, including a third filter element 61 and a fourth filter element 62 which are provided in series in the second pipeline 32, and the third filter element 61 and the fourth filter element 62 are located between the stirring tank 21 and the coating device 300;

pore sizes of the third filter element 61 and the fourth filter element 62 are different from pore sizes of the first filter element 41 and the second filter element 42.

The present disclosure further provides a photoresist coating system including a coating device 300 and a filter device 100, and the specific structure of the filter device 100 is referred to the foregoing embodiments. Since the photoresist coating system adopts all the technical solutions of all the foregoing embodiments, it has at least all the effects brought by the technical solutions of the foregoing embodiments, which is not described herein. The coating device 300 communicates with the stirring structure 20 through the second pipeline 32.

The above descriptions are only alternative embodiments of the present disclosure, and is not intended to limit the scope of the disclosure of the present disclosure. All the equivalent structural transformation made by the disclosure specification and the attached drawings under the idea of the disclosure, or directly/indirectly used in other relevant technical fields are included in the patent protection scope of the disclosure.

What is claimed is:

1. A filter device, applied to a photoresist coating system, wherein the filter device comprises:
a liquid storage tank, configured to hold photoresist to be filtered;
a stirring structure, comprising a stirring tank and a stirring assembly at least partially received in the stirring tank;
a first pipeline, one end of the first pipeline communicating with the liquid storage tank, the other end of the first pipeline communicating with the stirring tank;
a first filter assembly, provided on the first pipeline and located between the liquid storage tank and the stirring tank;
a first pressure detection assembly, provided on the first pipeline and configured to detect a pressure of the photoresist in the first pipeline; and
a second pipeline, one end of the second pipeline communicating with the stirring tank, the other end of the second pipeline being connected to a coating device;
wherein the liquid storage tank comprises a tank body and a first adapter, the tank body having a receiving cavity configured to hold the photoresist and defining a first opening communicating with the receiving cavity, the first adapter being installed at the first opening, one end of the first pipeline passing through the first adapter to be received in the receiving cavity;
the filter device further comprises a vent pipe, one end of the vent pipe passing through the first adapter to be received in the receiving cavity, the other end of the vent pipe being connected with an air pump.

2. The filter device of claim 1, wherein, the first adapter defines a first adjustment hole communicating with the receiving cavity, one end of the first pipeline passing through the first adjustment hole and extending into the receiving cavity, a length of the first pipeline extending into the receiving cavity being adjustable through the first adjustment hole.

3. The filter device of claim 2, wherein, the first adapter defines a second adjustment hole communicating with the receiving cavity, one end of the vent pipe passing through the second adjustment hole and extending into the receiving cavity, a length of the vent pipe extending into the receiving cavity being adjustable through the second adjustment hole.

4. The filter device of claim 3, wherein, the length of the first pipeline extending into the receiving cavity is greater than the length of the vent pipe extending into the receiving cavity.

5. The filter device of claim 3, wherein, the first pipeline extends into the receiving cavity and is located below a liquid level of the photoresist to be filtered in the receiving cavity, and the vent pipe extends into the receiving cavity and is located above the liquid level of the photoresist to be filtered in the receiving cavity.

6. The filter device of claim 1, wherein, the liquid storage tank further comprises a sealing ring provided at the first opening, the sealing ring being sandwiched between the first adapter and inner wall of the first opening, and configured to seal the first adapter and the first opening of the tank body.

7. The filter device of claim 1, wherein, the first filter assembly comprises a first filter element and a second filter element which are provided in series in the first pipeline, the first filter element being close to the liquid storage tank, the second filter element being close to the stirring tank, a pore size of the first filter element being greater than or equal to a pore size of the second filter element;
the first pressure detection assembly comprises a first pressure detector and a second pressure detector; the first pressure detector is located between the liquid storage tank and the first filter element, configured to detect a pressure of the photoresist in the first pipeline before filtering; the second pressure detector is located between the second filter element and the stirring tank, configured to detect a pressure of the photoresist in the first pipeline after filtering.

8. The filter device of claim 1, wherein, the stirring tank defines a second opening and a second adapter covering the second opening, the other end of the first pipeline and one end of the second pipeline passing through the second adapter and extending into the stirring tank;
the stirring assembly comprises a stirring rod rotatably penetrating the second adapter, a stirring head, and an actuator, the stirring head being connected to one end of the stirring rod extending into the stirring tank, the actuator being provided at one end of the stirring rod away from the stirring head, the actuator driving the stirring rod to drive the stirring head to rotate, to stir the photoresist in the stirring tank.

9. The filter device of claim 7, wherein, the filter device further comprises:
a second filter assembly, comprising a third filter element and a fourth filter element which are provided in series in the second pipeline, the third filter element and the fourth filter element being located between the stirring tank and the coating device, the third filter element being close to the stirring tank, the fourth filter element being close to the coating device, a pore size of the third filter element being greater than or equal to a pore size of the fourth filter element;
a second pressure detection assembly, provided on the second pipeline, the second pressure detection assembly comprising a third pressure detector and a fourth pressure detector, the third pressure detector being located between the stirring tank and the third filter element, configured to detect a pressure of the photoresist in the second pipeline before filtering, the fourth pressure detector being located between the fourth filter element and the coating device, configured to detect a pressure of the photoresist in the second pipeline after filtering.

10. The filter device of claim 9, wherein, the filter device further comprises a sampling detection assembly provided between the fourth pressure detector and the coating device, the sampling detection assembly comprising a sampling pipe connected to the second pipeline, and a sampling valve connected to the sampling pipe.

11. The filter device of claim 10, wherein, the filter device further comprises a first shutoff valve provided on the second pipeline, the first shutoff valve being located between the sampling pipe and the coating device.

12. The filter device of claim 10, wherein, the filter device further comprises a third pipeline and a second shutoff valve provided on the third pipeline, one end of the third pipeline communicating with the sampling pipe, the other end of the third pipeline communicating with the stirring tank.

13. A filter device, applied to a photoresist coating system, wherein, the filter device comprises:
a liquid storage tank, configured to hold photoresist to be filtered;
a stirring structure, comprising a stirring tank and a stirring assembly at least partially received in the stirring tank;
a first pipeline, one end of the pipeline communicating with the liquid storage tank, the other end of the first pipeline communicating with the stirring tank;
a first filter assembly, comprising a first filter element and a second filter element which are provided in series on the first pipeline, the first filter element and the second filter element being located between the liquid storage tank and the stirring tank;
a first pressure detection assembly, provided on the first pipeline and configured to detect a pressure of the photoresist in the first pipeline;
a second pipeline, one end of the second pipeline communicating with the stirring tank, the other end of the second pipeline being connected to a coating device; and
a second filter assembly, comprising a third filter element and a fourth filter element which are provided in series in the second pipeline, the third filter element and the fourth filter element being located between the stirring tank and the coating device;
wherein, pore sizes of the third filter element and the fourth filter element are different from pore sizes of the first filter element and the second filter element.

14. A photoresist coating system, wherein, the photoresist coating system comprises:
a filter device, comprising:

a liquid storage tank, configured to hold photoresist to be filtered;

a stirring structure, comprising a stirring tank and a stirring assembly at least partially received in the stirring tank;

a first pipeline, one end of the first pipeline communicating with the liquid storage tank, the other end of the first pipeline communicating with the stirring tank;

a first filter assembly, provided on the first pipeline and located between the liquid storage tank and the stirring tank;

a first pressure detection assembly, provided on the first pipeline and configured to detect a pressure of the photoresist in the first pipeline; and a second pipeline, one end of the second pipeline communicating with the stirring tank, the other end of the second pipeline being connected to a coating device; and a coating device communicating with the stirring structure through the second pipeline;

wherein the liquid storage tank comprises a tank body and a first adapter, the tank body having a receiving cavity configured to hold the photoresist and defining a first opening communicating with the receiving cavity, the first adapter being installed at the first opening, one end of the first pipeline passing through the first adapter to be received in the receiving cavity;

the filter device further comprises a vent pipe, one end of the vent pipe passing through the first adapter to be received in the receiving cavity, the other end of the vent pipe being connected with an air pump.

15. The photoresist coating system of claim 14, wherein, the first adapter defines a first adjustment hole communicating with the receiving cavity, one end of the first pipeline passing through the first adjustment hole and extending into the receiving cavity, a length of the first pipeline extending into the receiving cavity being adjustable through the first adjustment hole;

and/or, the first adapter defines a second adjustment hole communicating with the receiving cavity, one end of the vent pipe passing through the second adjustment hole and extending into the receiving cavity, a length of the vent pipe extending into the receiving cavity being adjustable through the second adjustment hole;

and/or, the length of the first pipeline extending into the receiving cavity is greater than the length of the vent pipe extending into the receiving cavity;

and/or, the liquid storage tank further comprises a sealing ring provided at the first opening, the sealing ring being sandwiched between the first adapter and inner wall of the first opening, and configured to seal the first adapter and the first opening of the tank body.

16. The photoresist coating system of claim 15, wherein, the first filter assembly comprises a first filter element and a second filter element which are provided in series in the first pipeline, the first filter element being close to the liquid storage tank, the second filter element being close to the stirring tank, a pore size of the first filter element being greater than or equal to a pore size of the second filter element;

the first pressure detection assembly comprises a first pressure detector and a second pressure detector; the first pressure detector is located between the liquid storage tank and the first filter element, configured to detect a pressure of the photoresist in the first pipeline before filtering; the second pressure detector is located between the second filter element and the stirring tank, configured to detect a pressure of the photoresist in the first pipeline after filtering.

17. The photoresist coating system of claim 16, wherein, the filter device further comprises:

a second filter assembly, comprising a third filter element and a fourth filter element which are provided in series in the second pipeline, the third filter element and the fourth filter element being located between the stirring tank and the coating device, the third filter element being close to the stirring tank, the fourth filter element being close to the coating device, a pore size of the third filter element being greater than or equal to a pore size of the fourth filter element;

a second pressure detection assembly, provided on the second pipeline, the second pressure detection assembly comprising a third pressure detector and a fourth pressure detector, the third pressure detector being located between the stirring tank and the third filter element, configured to detect a pressure of the photoresist in the second pipeline before filtering, the fourth pressure detector being located between the fourth filter element and the coating device, configured to detect a pressure of the photoresist in the second pipeline after filtering.

18. The photoresist coating system of claim 17, wherein, the filter device further comprises a sampling detection assembly provided between the fourth pressure detector and the coating device, the sampling detection assembly comprising a sampling pipe connected to the second pipeline, and a sampling valve connected to the sampling pipe;

the filter device further comprises a first shutoff valve provided on the second pipeline, the first shutoff valve being located between the sampling pipe and the coating device;

the filter device further comprises a third pipeline and a second shutoff valve provided on the third pipeline, one end of the third pipeline communicating with the sampling pipe, the other end of the third pipeline communicating with the stirring tank.

* * * * *